United States Patent
Takahashi et al.

(10) Patent No.: US 7,184,322 B2
(45) Date of Patent: Feb. 27, 2007

(54) SEMICONDUCTOR MEMORY DEVICE AND CONTROL METHOD THEREOF

(75) Inventors: Hiroyuki Takahashi, Kanagawa (JP); Takato Shimoyama, Kanagawa (JP); Takuya Hirota, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/985,876

(22) Filed: Nov. 12, 2004

(65) Prior Publication Data

US 2005/0105380 A1  May 19, 2005

(30) Foreign Application Priority Data

Nov. 13, 2003  (JP)  ............... 2003-383648

(51) Int. Cl.
G11C 7/10 (2006.01)
G11C 8/00 (2006.01)
(52) U.S. Cl. .............. 365/189.02; 365/238.5; 365/189.03; 365/230.02; 365/239; 365/221
(58) Field of Classification Search ............... 365/239, 365/238.5, 230.02, 189.03, 189.02
See application file for complete search history.

(56) References Cited

U.S. PATENT DOCUMENTS 5,600,606 A * 2/1997 Rao ..................... 365/233

2003/0146950 A1 * 8/2003 Miyo et al. ................ 347/19

FOREIGN PATENT DOCUMENTS

JP 2-177190 7/1990
JP 2003-233989 8/2003

OTHER PUBLICATIONS

"Memory for Cellular Phone Applications Mobile FCRAM (R) Equipped With High-Speed Page Mode MB82DPS02183B/MB82DP02322A", Fujitsu Electric Devices News Find vol. 20, No. 6, 2002.

* cited by examiner

Primary Examiner—Amir Zarabian
Assistant Examiner—Michael Weinberg
(74) Attorney, Agent, or Firm—Young & Thompson

(57) ABSTRACT

A semiconductor memory device has common terminals shared between a part or all of address terminals for receiving n bits of an address signal and data terminals for outputting a data signal with its bit width of n bits or less and dedicated address terminals for receiving m bits of the address signal, wherein at the time of a read, after the n bits of the address signal have been input, a plurality of data signals within a selected page are consecutively read out through the common terminals using the m bits of the address signal input from the dedicated address terminals.

17 Claims, 13 Drawing Sheets

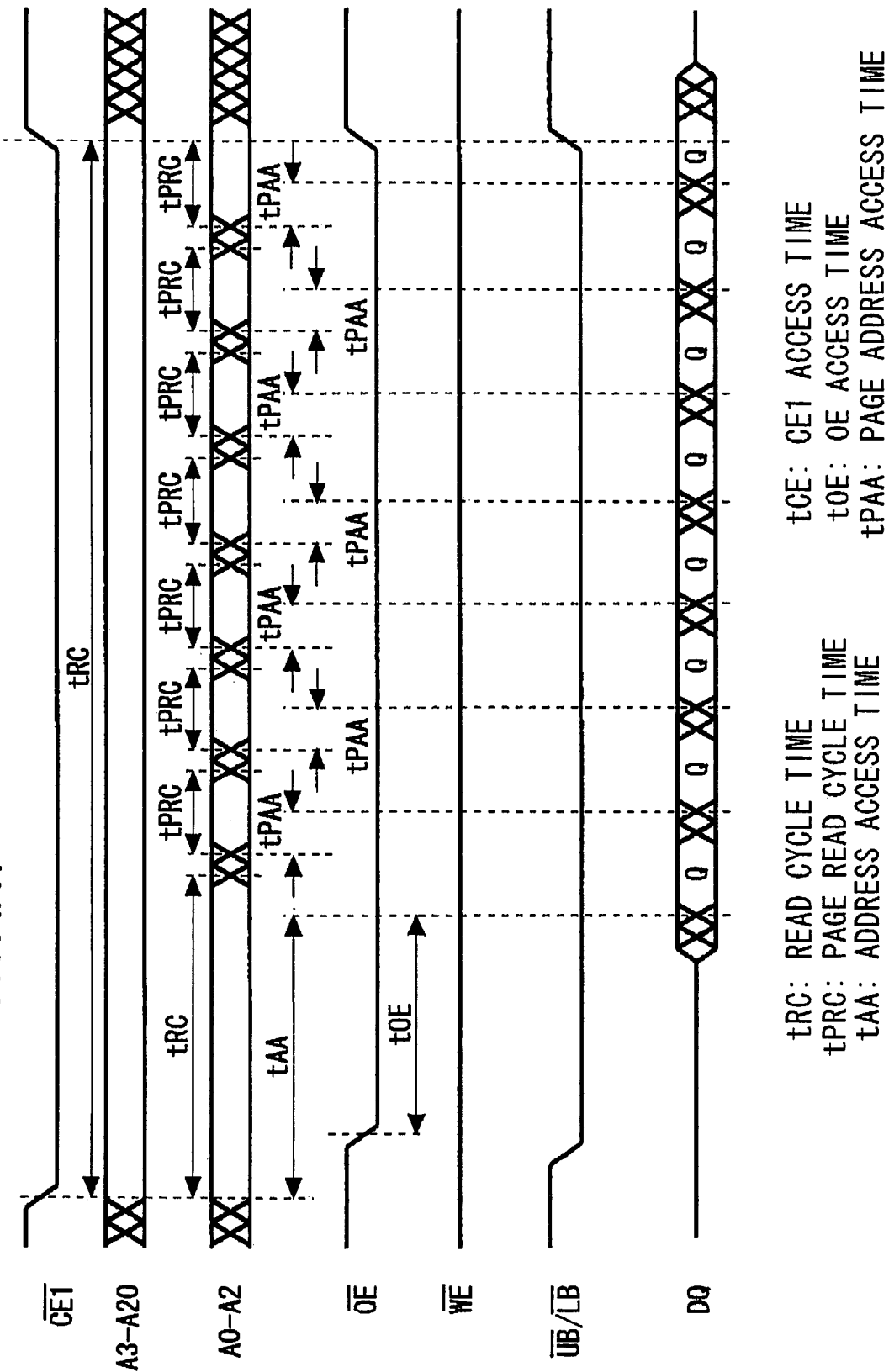

SEMICONDUCTOR MEMORY DEVICE AND CONTROL METHOD THEREOF

FIELD OF THE INVENTION

The present invention relates to a semiconductor memory device. More specifically, the invention relates to a semiconductor memory device in which address and data terminals are multiplexed.

BACKGROUND OF THE INVENTION

Semiconductor memory devices which have an address terminal (pin) for receiving an address signal and a data terminal (pin) for receiving or outputting a data signal, for common use, have been hitherto known. In these devices, the address signal and the data signal are multiplexed for use, so that reduction of the number of the terminals is effected (refer to Patent Document 1 which will be described later, for example). FIG. 8 is a diagram showing a configuration of a semiconductor memory device described in the hereinafter described Patent Document 1.

As shown in FIG. 8, this static type RAM (random access memory) includes a static memory cell array 4, a row decoder 5, a column decoder 6, a read/write buffer (also referred to as a "read/write amplifier") 7, latch circuits 8A to 8C, an output buffer 9, address terminals $A_{14-8}$ for receiving upper seven bits A14 to A8 of an address signal, an address and data common terminals 2 shared by lower eight bits A7 to A0 of the address signal and parallel eight-bit D7 to D0 of a data signal, control terminals for receiving a write enable signal /WE for controlling a write, an output enable signal /OE for controlling data reading, and a chip select signal /CS for controlling chip activation, respectively. In the configuration shown in FIG. 8, A7 to A0 of the address signal are latched by the latch circuit 8B at a falling edge of the chip select signal /CS and latched address signal is supplied to the column decoder 6. Until the chip select signal /CS rises, the common terminal 2 functions as the data terminal. During a period in which the write enable signal /WE is inactive (high), the latch circuit 8A outputs A14 to A8 of the address signal with alteration. When the write enable signal /WE becomes active (low), the latch circuit 8A holds its output value. The latch circuit 8C samples D7-D0 of the data signal at the common terminals 2 at a transition edge of the write enable signal /WE from a high level to a low level.

FIGS. 9A and 9B are timing diagrams for explaining timing operations of a read cycle and a write cycle of the semiconductor memory device shown in FIG. 8, respectively. Referring to FIG. 8 and FIG. 9A, at the time of a read, A0 to A14 of the 15 bit address signal are supplied from a CPU not shown through an address bus, and the chip select signal /CS is made active (low)(at a time t1). Then, the lower 8 bits of the address signal A7 to A0 are latched by the latch circuit 8B. Thereafter, the common terminal 2 is brought to a high impedance state and then the output enable signal /OE is made active (low). Eight-bit read data D7 to D0 are thereby output in parallel from the output buffer 9 to the common terminal 2 at a time t2.

Next, referring to FIGS. 8 and 9B, at the time of a write, the A0 to A14 of the address signal are output from the CPU not shown through the address bus, and the chip select signal /CS is made low (at a time t3). Then, the lower eight bits of the address signal A7 to A0 are latched by the latch circuit 8B. Thereafter, eight-bit write data D7 to D0 are supplied to the common terminals 2 from the CPU. At a time t4, the write enable signal /WE is activated (made low), so that D7 to D0 are latched by the latch circuit 8C, and writing of the eight-bit data D7 to D0 to a selected memory cell is performed through the write buffer 7. The Patent Document 1 describes a configuration of a dynamic type RAM as well, in which by having the address terminals and the data terminals for common use, reduction of the number of terminals is effected. In the dynamic-type RAM, a lower address is latched at a fall of a low address strobe signal /RAS and an upper address is latched at a fall of a column address strobe signal /CAS, for supply to a row decoder and a column decoder, respectively.

Recently, in addition to a calling function, multi-media functions such as image transmission by an electronic mail, distribution of music and moving pictures using accesses to the Internet are included in portable terminals, so that higher performance and larger capacity of a memory mounted therein are demanded. As a semiconductor memory device for the portable terminal, of which the larger capacity and the higher performance are demanded, a semiconductor memory that includes a page mode function and enabled a high-speed page read has been developed (refer to a hereinafter described Non-patent Document 1, for example). Further, a DRAM (also referred to as a "pseudo-SRAM") that includes an auto precharging function for simulating an SRAM (static random access memory) and can read data in a burst mode and a page mode is also known (refer to Patent Document 2).

An overview of a page mode operation of a semiconductor memory device compliant with an asynchronous SRAM interface for the portable terminal will be described below. In the page mode (referred to as a "high-speed page mode"), a plurality of words within the same page are consecutively accessed. FIG. 10 is a diagram showing operation timing at the time of a read in the page mode, and is based on FIG. 3, page 26 of the hereinafter described Non-patent Document 1. At the beginning of a read mode, a chip enable signal CE1 is made active (low), and the output enable signal /OE is also made low (low). The write enable signal /WE is kept inactive (high) because of the read mode. In the example shown in FIG. 10, an address within a page (with the page size thereof being eight words) is specified by the address signal A0 to A2 indicating the lower three bits out of 21 bit address signal A0 to A20, and eight words of plural read data signals within the same page are consecutively output from a data terminal DQ. As described above, in the page mode, the performance when collective data is consecutively read is improved. In the example in FIG. 10, a page address time tpAA, which is an access time from a transition of a page address to output of corresponding word data to the data terminal DQ is set to several tens of nanoseconds, for example. Signals UB and LB in FIG. 10 are the signals for controlling upper byte/lower byte access, and is made low for word-based read and write, for example. Since they are the signals that are not directly related to the subject of the present invention, their description will be omitted.

[Patent Document 1]
JP Patent Kokai Publication No. JP-A-2-177190 (Pages 3–4, FIGS. 2–6)

[Patent Document 2]
JP Patent Kokai JP-P2003-233989A (Pages 3–4, FIGS. 1–2)

[Non-patent Document 1]
"MEMORY FOR CELLULAR PHONE APPLICATIONS MOBILE FCRAM (R) EQUIPPED WITH HIGH-SPEED PAGE MODE MB82DPS02183B/MB82DP02322A", FUJITSU ELECTRIC DEVICES NEWS FIND Vol. 20, No. 6, 2002, Internet URL<http://edevice.fujitsu.com/jp/catalog/find/20-6/pdf/24-27.pdf> (searched on Sep. 11, 2003)

SUMMARY OF THE DISCLOSURE

As described above, the capacity of the memory for portable applications supporting multi-media functions, for example, has remarkably increased in the portable terminal and the like. Accompanying it, the number of the address signal (the number of bits) has also increased. When the semiconductor memory device described in the Non-patent Document 1, for example, which is synchronous-SRAM-interface compatible and equipped with the high-speed page mode function, has a configuration of 2M words×16 bits (32M bits), the device requires a total of 37 pins for the address signal of 21 bits (21 address pins) and data signals of 16 bits (16 I/O pins). With a further increase in the memory capacity from now on, an increase in the number of address pins is inevitable, thus leading to an increase in the area and size of the semiconductor memory device.

Accordingly, it is an object of the present invention to provide a semiconductor memory device adopting a completely novel design architecture that enables high-speed access while preventing an increase in the number of terminals, and its control method.

The above and other objects are attained by a semiconductor memory device according to one aspect of the present invention, in which a part of address terminals are combined with data terminals for sharing, and a part of the remainder of the address terminals are used for addresses for consecutive accesses within a page. In the present invention, the part of the address terminals constitutes common terminals shared with the data terminals for output and/or input, the part or all of the remainder of the address terminals are used as dedicated address terminals for making access within the page, and at least one of consecutive output and input of a plurality of data signals within the page selected by an address from the common terminal are performed through the common terminals based on the address signal input to the dedicated address terminals.

In a semiconductor memory device according to another aspect of the present invention, for receiving an address signal of (n+m) bits and making access to a memory cell array, n and m being predetermined positive integers, the semiconductor memory device includes at least:

n pieces of common terminals shared between a part or all of an address terminals for receiving the n bits of the address signal and data terminals for outputting data with a bit width thereof being n bits or less; and m pieces of dedicated address terminals for receiving the m bits of the address signal; wherein at the time of a read, after the n bits of the address signal have been input from the common terminals, a plurality of data signals within a page are consecutively read out through the common terminals, based on the m bits of the address signal input from the dedicated address terminals.

A semiconductor memory device according to still another aspect (a third aspect) of the present invention, for receiving an address signal of (n+m) bits and making access to a memory cell array, n and m being predetermined positive integers, includes at least:

a common terminal shared between a part or all of an address terminal for receiving the n bits of the address signal and a data terminal for receiving and outputting data with a bit width thereof being n bits or less; and a dedicated address terminal for receiving the m bits of the address signal; wherein at the time of a write, after the n bits of the address signal have been input, a plurality of data signals consecutively input from the common terminal are written into a selected page, based on the address signal input from the dedicated address terminals.

The semiconductor memory device according to the second aspect of the present invention may further include:

a control circuit for receiving a control signal indicating that the address signal supplied to the semiconductor memory device from the outside of the semiconductor memory device is valid and generating a latch timing signal based on the control signal;

a latch circuit for sampling the address signal input from the common terminals based on the latch timing signal and supplying the sampled address signal to a decoder for decoding the address signal; and a multiplexer circuit for receiving the plurality of data within the page read out from the memory cell array in parallel and performing control so that the plurality of data is multiplexed into one data and sequentially output from the common terminals based on the m bits of the address signal input from the dedicated address terminal, at the time of a read. In the present invention, the common terminal may also be constituted from an input and output terminal for performing both data output and data input, and at the time of a write, after the n bits of the address signal have been input, a plurality of data signals consecutively input from the common terminals may be written into a selected page, based on the address signal input from the dedicated address terminals.

The semiconductor memory device according to the third aspect of the present invention may further include:

a control circuit for receiving a control signal indicating that the address signal supplied to the semiconductor memory device from the outside of the semiconductor memory device is valid and generating a latch timing signal based on the control signal;

a latch circuit for sampling the address signal input from the common terminals based on the latch timing signal and supplying the sampled address signal to a decoder for decoding the address signal; and a demultiplexer circuit for separating plural data signals sequentially input to the common terminals into a plurality of parallel data signals using the m bits of the address signal input from the dedicated address terminals and supplying the separated parallel data signal to the cell array, at the time of the write.

The semiconductor memory device according to the second aspect of the present invention may further include an output buffer with an output terminal thereof connected to the common terminal. The multiplexer circuit may include:

a plurality of switches with the one terminals thereof connected in common to the input terminal of the output buffer and respective other terminals thereof connected to output terminals of corresponding read amplifiers; and a control circuit for controlling on and off of the plurality of switches based on the m bits of the address signal. The multiplexer circuit may sequentially output the plurality of data output in parallel from the read amplifiers to the input terminal of the output buffer through the switches.

In the semiconductor memory device according to the third aspect of the present invention, the demultiplexer circuit may include:

a plurality of latch circuits for receiving the data supplied to the common terminal from input terminals thereof in common and having respective output terminals thereof connected to corresponding write amplifiers; and a timing control circuit for supplying a plurality of sampling clock signals having mutually different phases to the respective latch circuits based on the m bits of the address signal. This timing control circuit may be configured to receive a signal for writing control, being active, and generate a plurality of sampling clock signals having mutually different phases, in response to a change in the values of the m bits of the address signal.

The semiconductor memory device according to a still other aspect of the present invention may further include:

an address/data switching control circuit for receiving from the outside of the semiconductor memory device at least a first control signal indicating that an address signal supplied to the semiconductor memory device is valid, a second control signal for controlling data writing, and a third control signal for controlling output of read data and supplying a plurality of control signals required for circuits within the semiconductor memory device based on the input first through three control signals;

an input buffer having an input terminal thereof connected to the common terminal, for receiving a fourth control signal output from the address/data switching control circuit as being active, as an output control signal, when the third control signal for controlling the output of the read data is inactive, activation and deactivation of the input buffer being controlled by the input output control signal, the input buffer outputting signals from the input terminal thereof when the activation is performed;

a first latch circuit for receiving as a sampling clock a fifth control signal output from the address/data switching control circuit as being active upon receipt of activation of the first control signal indicating that the address signal is valid, sampling the address signal output from the input buffer in response to the input sampling clock signal, and outputting the sampled address signal to a decoder for decoding the address signal;

a second latch circuit for receiving a sixth control signal output from the address/data switching control circuit as a sampling clock signal upon receipt of activation of the second control signal for controlling the writing and sampling the data signal output from the input buffer in response to the input sampling clock signal to output the sampled data signal;

an output buffer for receiving a seventh control signal output from the address/data switching control circuit as being active, as an output control signal, when the third control signal for controlling the output of the read data is active, activation and deactivation of the output buffer being controlled by the input output control signal, the output buffer outputting the read data to the common terminals when the activation is performed;

an in-page address decoder for receiving the address signal input from the dedicated address terminals and decoding an in-page address; and a register/multiplexer circuit including a multiplexer circuit, having a storage unit for receiving a predetermined number of data for storage and retention, the register/multiplexer circuit storing a plurality of data sequentially output from the second latch circuit based on the result of the decoding by the in-page address decoder and outputting the plurality of data to the cell array in parallel at a time of a write in a page mode, and receiving the read data from the cell array in parallel and sequentially outputting the read data to the output buffer based on the result of the decoding by the in-page address decoder. In the present invention, preferably, the storage unit is constituted from a register for storing one page of the data.

According to the present invention, a page is constituted from $2^m$ words, and consecutive accesses to $2^m$ word data within the page are made.

A method of the present invention having a part of address terminals thereof constituting common terminals shared with data terminals for output or input and output and having a part or all of the remainder of the address terminals used as address terminals for making access within a page, includes the steps of:

latching the address signal input from the common terminal; and using the common terminals as the data terminals after the address signal have been latched and consecutive accesses to data signals within the page being performed, based on address signal input from the address terminals for making access within the page.

In the method of the present invention, the semiconductor memory device receives an address signal of (n+m) bits, n and m being predetermined positive integers;

n pieces of the common terminals are shared between the part or all of the address terminal for receiving the n bits of the address signal and the data terminal for outputting data with a bit width thereof being the n bits or less;

m pieces of the dedicated address terminals for making access within the page receive the m bits of the address signal; and at the time of a read, after the n bits of the address signal have been input, a plurality of data signals within the selected page are consecutively read out through the common terminal using the m bits of the address signal input from the dedicated address terminals.

In the method of the present invention, the dedicated address terminal for making access within the page may input the m bits of the address signal; and at the time of a write, after the n bits of the address signal have been input, a plurality of data signals consecutively input from the common terminal may be written into the selected page using the m bits of the address signal input from the dedicated address terminal.

The meritorious effects of the present invention are summarized as follows.

According to the present invention, in a semiconductor memory device with an address terminal and a data terminal thereof multiplexed, at the time of inputting and/or outputting data from an address and data common terminal, consecutive accesses to a plurality of data within a page are made, using the remainder of an address. Reduction in the number of pins and the circuit size can be thereby achieved, and high-speed access also becomes possible.

The present invention achieves reduction in the number of pins and also implements high-speed processing, so that the invention is made suitable for being applied to an asynchronous type pseudo SRAM and the like.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIG. 10 is a timing diagram explaining the high-speed page mode of an asynchronous SRAM interface compatible semiconductor memory device;

PREFERRED EMBODIMENTS OF THE INVENTION

Figure 1:
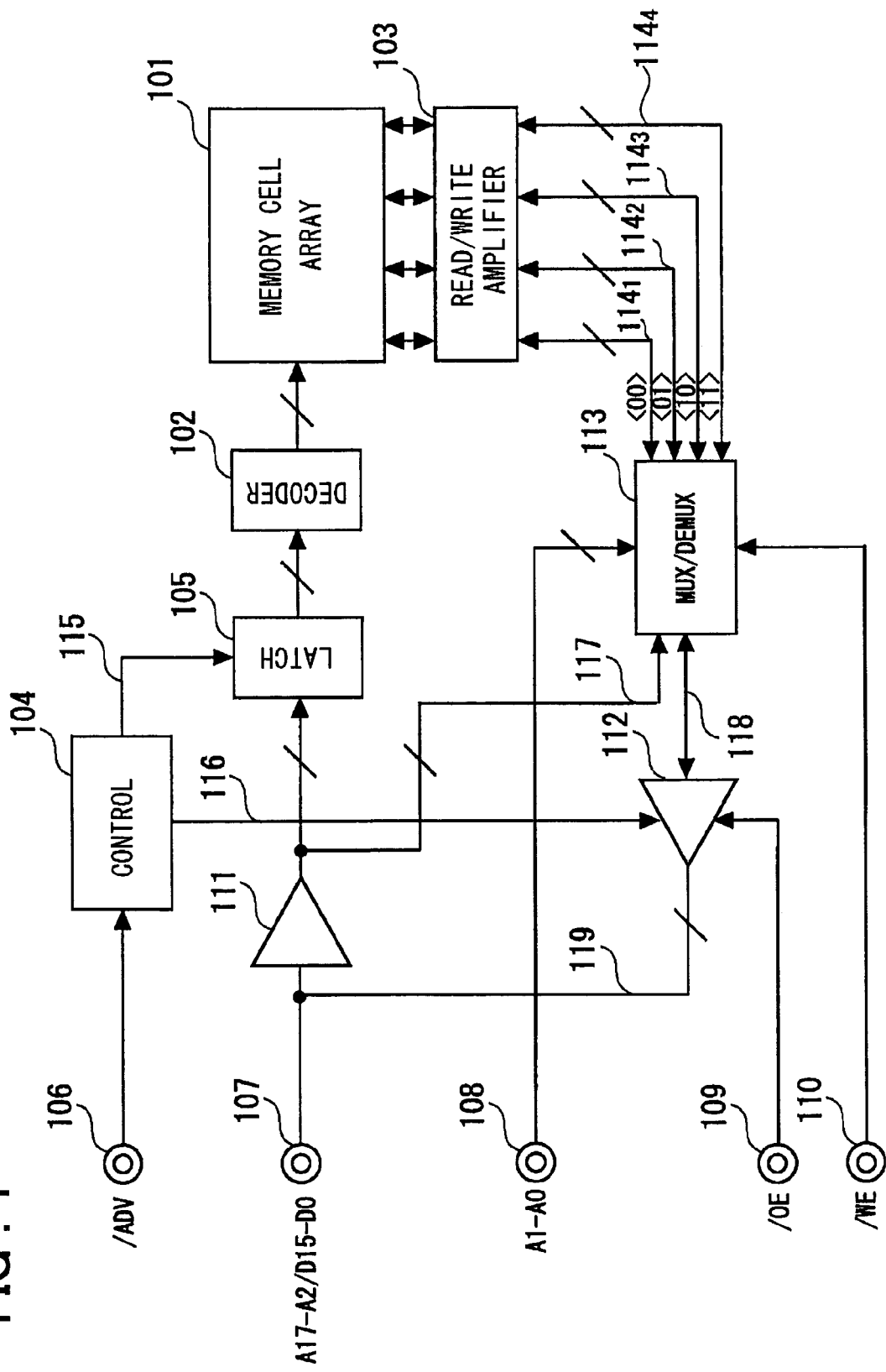
FIG. 1 is a diagram showing a configuration of an embodiment of the present invention.

The preferred embodiment of the present invention will be described. In a semiconductor memory device according to an embodiment of the present invention having a configuration with an address terminal and a data terminal multiplexed, at the time of inputting and/or outputting data from an address and data common terminal (107), a lower address (such as A1 to A0), which is the remainder of an address signal is used as a page address and consecutive accesses to a plurality of data signals within a page are made. More specifically, the embodiment of the present invention includes: common terminals (107) shared between a part or all of address terminals for receiving n bits of an address signal and data terminals for outputting data with a bit width of n bits or less; and dedicated address terminals (108) for receiving m bits of the address signal. At the time of a read, after the n bits of the address signal have been input from the common terminals (107), $2^m$ of plural data signals within a selected page are consecutively read out through the common terminal (107) using the m bits of the address signal input from the m bits dedicated address terminals (108).

According to the embodiment of the present invention, at the time of a write, after the n bits of the address signal have been input from the common terminal (107), a plurality of data signals sequentially input from the common terminal (107) are demultiplexed into plural data signals using the m bits of the address signal input from the dedicated address terminal (108), and are written into a selected page.

A semiconductor memory circuit according to another embodiment of the present invention includes an address/data switching control circuit (204), an input buffer (211), a first latch circuit (205A), a second latch circuit (205B), an output buffer (212), a decoder (210), and a register/multiplexer circuit (213) as circuits for controlling writing to and reading from a cell array in a page mode. Among these, the address/data switching control circuit (204) receives at least a first control signal (ADV) indicating that an address signal supplied from the outside of the semiconductor memory device to the semiconductor memory device is valid, a second control signal (WE) for controlling data writing, a third control signal (OE) for controlling output of read data, and supplies a plurality of control signals required for circuits within the semiconductor memory device. More specifically, the address/data switching control circuit (204) activates a fourth control signal (219) for output when the third control signal (OE) for controlling output of read data is inactive. The address/data switching control circuit (204) outputs a fifth control signal (217) as being active upon receipt of activation of the first control signal (ADV) indicating that the address signal is valid, activates a sixth control signal (218) for output upon receipt of activation of the second control signal (WE) for controlling writing, and activates a seventh control signal (220) for output when the third control signal (OE) for controlling output of read data is active.

The input buffer (211) receives the fourth control signal (/OE) output from the address/data switching control circuit (204) as an output control signal, and activation and deactivation of the input buffer are controlled according to the input output control signal. When the input buffer is activated, the input buffer outputs a signal input from the common terminal (207).

The first latch circuit (205A) inputs the fifth control signal (217) output from the address/data switching control circuit (204) as a sampling clock signal, samples the address signal output from the input buffer (211) in response to the sampling clock signal, and outputs the sampled address signal to the decoder (202) for decoding the address signal.

The second latch circuit (205B) inputs the sixth control signal (218) output from the address/data switching control circuit (204) as a sampling clock signal and samples the data signal output from the input buffer (211) in response to the input sampling clock signal, to output the sampled data signal.

The output buffer (212) receives the seventh control signal (220) output from the address/data switching control circuit (204) as an output control signal, and activation and deactivation of the output buffer is controlled by the input output control signal. When the output buffer is activated, the output buffer outputs readout data to the common terminals (207).

The decoder (also referred to as an "in-page address decoder") (210) inputs the address signal input from the dedicated address terminals (208) and decodes an in-page address.

The register/multiplexer circuit (REG/MUX) (213) includes a storage unit (register) for storing one page of data signals, and a multiplexer circuit for storing a plurality of data signals sequentially output from the second latch circuit (205B) based on the result of decoding by the in-page address decoder (210), outputting the plurality of data signals in parallel as data for writing to the cell array (201), receiving readout data signals from the cell array (201) in parallel, and sequentially outputting the data signals to the output buffer (212) based on the result of decoding by the in-page address decoder (210).

This embodiment may be configured to include a control circuit (215) for receiving an eighth control signal output from the address/data switching control circuit (204) as a trigger signal upon receipt of activation of the first control signal (ADV) and outputting control signals (226, 227) for selecting the leading address of a page in the cell array to the cell array and the register/multiplexer circuit (213) based on the trigger signal. Alternatively, the present embodiment may be configured to include an address transition detecting circuit (216) for outputting a trigger signal upon detection of the transition of the address signal input from the common terminal (207) and include the control circuit (215) for receiving the trigger signal (225) output from the address transition detecting circuit (216) and outputting the control signals (226, 227) for selecting the leading address of the page in the memory cell array to the cell array and the register/multiplexer circuit (213).

[Embobiments]

The embodiments of the present invention will be described in more detail below with reference to the appended drawings. FIG. 1 is a diagram showing a configuration of a semiconductor memory device according to an example of an embodiment of the present invention. Referring to FIG. 1, the semiconductor memory device according to the present embodiment includes a memory cell array 101, a decoder 102, a read/write amplifier 103, a terminal 106 for receiving an address valid signal /ADV, a control circuit 104 for receiving at least the address valid signal/ ADV and generating a latch timing signal 115 and a signal 116 for output control, address and data common terminals 107, dedicated address terminals 108 for m bits (two bits of A1 to A0 in the drawing), a terminal 109 for receiving an output enable signal/OE, a terminal 110 for receiving a write enable signal /WE, an input buffer 111 for receiving a n bit signal (address signal/data signal) input to the address and data common terminals 107, a latch circuit 105 for latching an address signal of upper n bits output from the input buffer 111, an output buffer 112 for outputting a read data signal (D15 to D0) through the address and data common terminals 107, and a multiplexer/demultiplexer circuit 113. The address and data common terminals 107 are used in common as the terminals for the address signal of the upper n bits (16 bits from A17 to A2 in the drawing, wherein n is 16) and data signal of n bits (16 bits of D15 to D0 in the drawing). At the time of a read, the multiplexer/demultiplexer 113 receives four word data signals (one word constituted from 16 bits in the drawing) output from the read amplifier of the read/write amplifier 103 onto buses (read buses) $114_1$ to $114_4$ and sequentially outputs the data signal word by word onto a data line 118. At the time of a write, the multiplexer/ demultiplexer circuit 113 sequentially receives write data signals output from the input butter 111 onto a data line 117 and outputs four word data onto four buses (write buses) $114_1$ to $114_4$, respectively. For simplicity, a read bus/write bus in each of the buses $114_1$ to $114_4$ is illustrated by the same line.

The control circuit 104 generates the latch timing signal 115 based on the falling transition of the address valid signal /ADV indicating that an address signal output onto address buses (not shown) from a CPU (not shown) or the like, for example, is valid, and supplies the latch timing signal 115 to the latch circuit 105.

The latch circuit 105 samples A17 to A2 of the address signal supplied to the address and data common terminals 107, responsive to the latch timing signal 115 supplied from the control circuit 104 to output the sampled address signal to the decoder 102. After the address signal at the address and data common terminals 107 has been latched by the latch circuit 105, the address and data common terminals 107 are used as the data terminals. At this point, the CPU not shown (or a memory controller) sets the address and data common terminals 107 to be in a high-impedance state.

The decoder 102 includes a row decoder and a column decoder, not shown, decodes A17 to A2 of the address signal, and performs selection of a corresponding word line and a corresponding bit line for selecting a page specified by A17 to A2 of the address signal. In the configuration shown in FIG. 1, each page in the memory cell array 101 is constituted from four words. Meanwhile, referring to FIG. 1, the input buffer 111 and the output buffer 112 for the n bits constitute n-bit I/O cells. In FIG. 1, for simplicity, an input buffer or the like for the dedicated address terminal 108 is omitted.

Referring to FIG. 1, an operation of the semiconductor memory device according to the present embodiment will be described. First, a read operation in a page mode will be described. At the time of a read, four words within a page selected by A17 to A2 of the address signal are read out from the memory cell array 101, and four words of data signals are output in parallel onto the buses $114_1$ to $114_4$ through the read amplifiers in the read and write amplifier 103.

At the time of the read (while the write enable signal /WE is high), the multiplexer circuit of the multiplexer/demultiplexer circuit 113 sequentially supplies data signals selected by the lower 2 bits of the address signal A1 and A0 input from the dedicated address terminals 108 to the output buffer 111, and data bits D15 to D0 (16 bits parallel) are output on word by word from the address and data common terminals 107 that functions as the data terminals. On this occasion, the multiplexer circuit of the multiplexer/demultiplexer circuit 113 sequentially outputs data on four buses (read buses) $114_1$ to $114_4$ to the data line 118 when the value of the input address signal (A0, A1) changes to (0, 0), (0, 1), (1, 0), and (1, 1), for example, which will be described later in detail.

Incidentally, in the present embodiment, the output buffer 112 is constituted from a tri-state buffer of which an output takes one of high and low levels and the high impedance state. Upon receipt of the output enable signal /OE and the control signal 116 from the control circuit 104, the output buffer 112 is set to an output enable state (at the high/low level) or an output disable state (the high-impedance state). More specifically, when the output enable signal /OE supplied from the CPU not shown is made active (low) and the control signal 116 generated at the control circuit 104 based on the address valid signal /ADV is active, the output buffer 112 outputs data signal 119 from the address and data common terminals 107. The control signal 116 output from the control circuit 104 is made active when the address and data common terminals 107 function as the data terminals. When the output enable signal /OE is inactive, or the control signal 116 is inactive, the output buffer 112 is output-disabled.

Next, referring to FIG. 1, a write operation of the semiconductor memory device according to the present embodiment will be described. At the time of a write, the latch circuit 105 samples A17 to A2 of the address signal from the address and data common terminals 107, responsive to the latch timing signal 115 output from the control circuit 104 to supply the sampled address signal to the decoder 102, as at the time of the read. After the address signal at the address and data common terminals 107 have been latched by the latch circuit 105, the address and data common terminals 107 are used as the data terminals. At this point, the CPU not shown sets the output of an output circuit (not shown) connected to the address and data common terminal 107 to the high impedance state.

Four words of write data signals are sequentially supplied to the address and data common terminals 107 from the CPU not shown and supplied to the demultiplexer circuit of the multiplexer/demultiplexer circuit 113 through the input buffer 111.

As will be described in detail later, the demultiplexer circuit of the multiplexer/demultiplexer circuit 113 expands plural word data signals output from the input buffer 111 to the data line 117 onto the four buses (write buses) 114$_1$ to 114$_4$ when the values of (A0, A1) of the input address signal are (0, 0), (0, 1), (1, 0) and (1, 1), for example, and supplies the four words of data signals to the write amplifiers of the read/write amplifier 103 in parallel. Writing of four word data signals is then performed into a selected page in the memory cell array 101 from the write amplifiers of the read/write amplifier 103. Four word data signals transferred onto the write buses 114$_1$ to 114$_4$, respectively, are written into the selected page as first through fourth word data, respectively.

Figure 2:
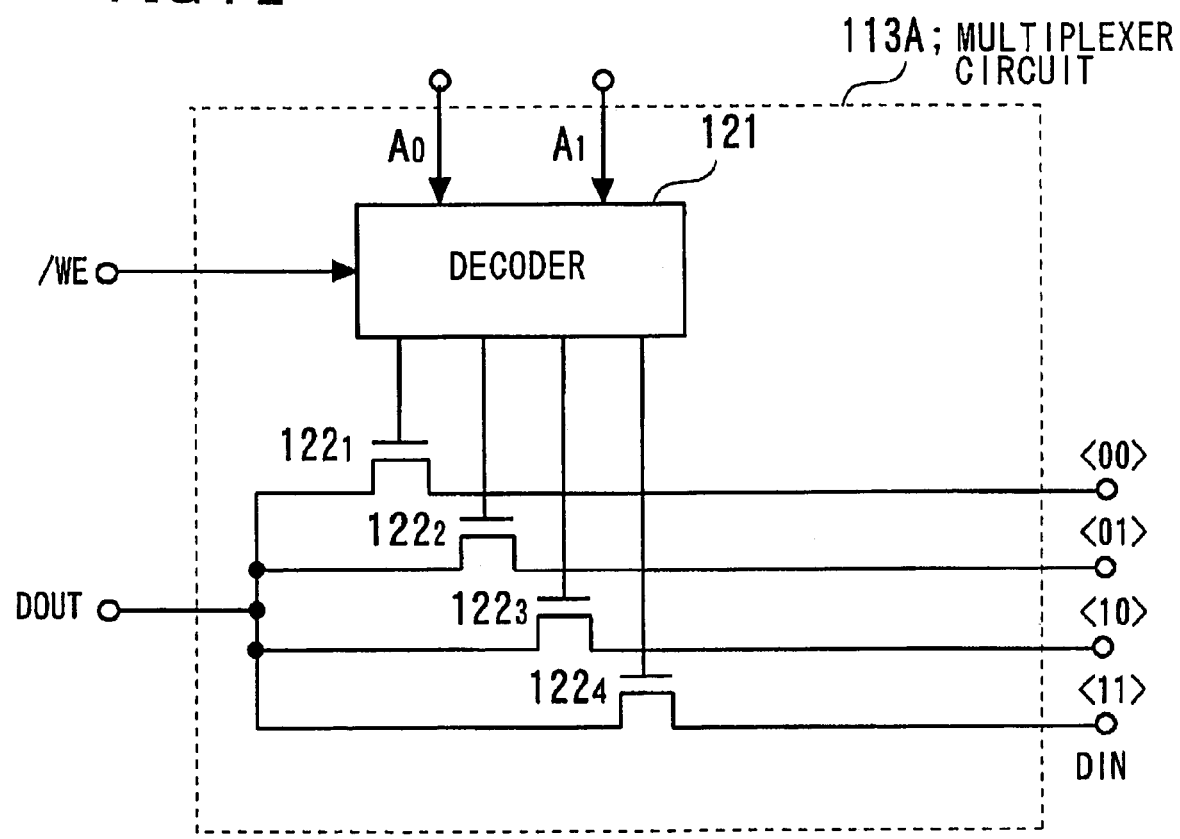
FIG. 2 is a diagram showing a configuration of a multiplexer circuit in the embodiment of the present invention.

FIG. 2 is a diagram showing an example of a configuration of the multiplexer circuit of the multiplexer/demultiplexer circuit 113 in FIG. 1. As shown in FIG. 2, a multiplexer circuit 113A includes a decoder 121 for receiving A0 and A1 of the address signal and four switch devices 122$_1$ to 122$_4$ that receive four outputs decoded by the decoder 121 at control terminals thereof and are on/off controlled. Respective one terminals of the four switch devices 122$_1$ to 122$_4$ are connected in common, and their common connecting node is connected to the data line 118 in FIG. 1. Respective other terminals of the four switch devices 122$_1$ to 122$_4$ constitute data input terminals (DIN) and are connected to the read buses of the buses 114$_1$ to 114$_4$ in FIG. 1. While FIG. 2 shows a configuration in which one switch is connected to each of one-bit signal lines of the buses 114$_1$ to 114$_4$, for simplicity, 16 switch devices are provided for each of the bus lines 114$_1$ to 114$_4$, for 16 bit data, for example.

Referring to FIG. 2, the decoder 121 is configured to be deactivated when the write enable signal/WE is inactive (low), and have four outputs from the decoder 121 fixed at a low level irrespective of the values of A0 and A1 of the address signal, for example. The decoder 121 is configured to be activated when the write enable signal/WE is high.

When a pair of lower two bits of the address signal (A0, A1) is (0, 0), (0, 1), (1, 0) and (1, 1), for example, the decoder 121 switches on the switch devices 122$_1$ to 122$_4$, respectively, and multiplexes data from the corresponding bus lines 114$_1$ to 114$_4$ (DIN terminals <00>, <01>, <10>, and <11> in the multiplexer circuit 113A), to supply the multiplexed data to the data line 118. Though n-channel pass transistors are used as the switch devices 122$_1$ to 122$_4$ in the example shown in FIG. 2, the present invention is not limited to this configuration.

Figure 3:
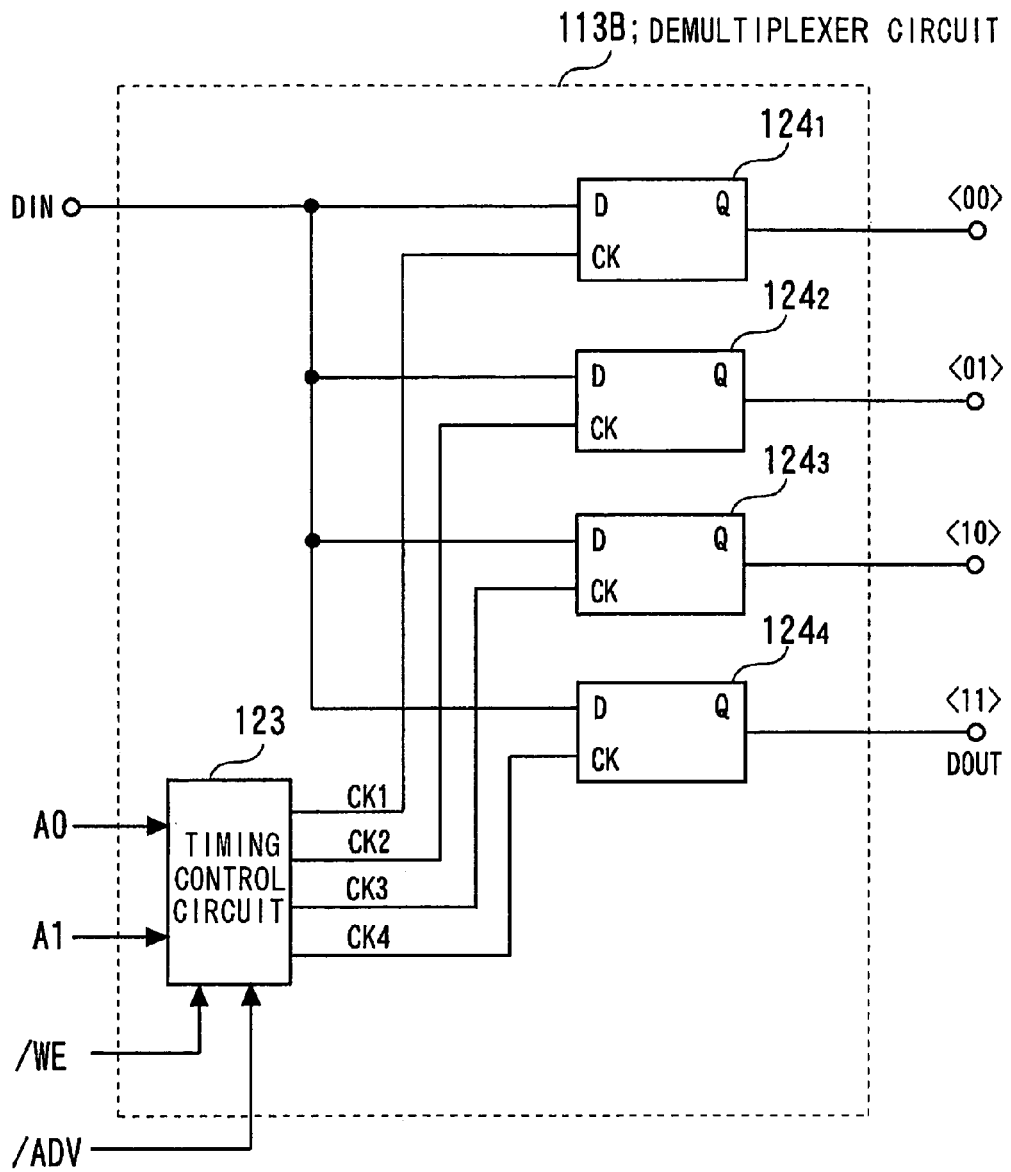
FIG. 3 is a diagram showing an example of a configuration of a demultiplexer circuit in the embodiment of the present invention.

FIG. 3 is a diagram showing an example of a configuration of the demultiplexer circuit of the multiplexer/demultiplexer circuit 113 in FIG. 1. As shown in FIG. 3, a demultiplexer circuit 113B includes latch circuits 124$_1$ to 124$_4$ and a timing control circuit 123. Data terminals D of the latch circuits 124$_1$ to 124$_4$ are connected in common to a data input terminal DIN connected to the data line 117 in FIG. 1. The timing control circuit 123 outputs sampling signals to the latch circuits 124$_1$ to 124$_4$ based on the values of A0 and A1, the lower two bits of the address signal, input to the dedicated address terminals 108 at the time of data writing (when the write enable signal/WE is low). Data output terminals DOUT <00> to <11> are connected to the bus lines 114$_1$ to 114$_4$ in FIG. 1.

Upon receipt of a falling transition of the address valid signal/ADV (the transition to an active state), the timing control circuit 123 supplies a one-shot pulse (clock pulse) CK1 for sampling to the latch circuit 124$_1$ for example. At this point, the values of (A1, A0) are set to (0, 0). The latch circuit 124$_1$ latches a data signal supplied to the data input terminal DIN, responsive to the one-shot pulse CK1, to output the latched data signal to the data output terminal DOUT <00>. Then, upon receipt of the transition of (A1, A0) from (0, 0) to (0, 1), the timing control circuit 123 generates a one-shot pulse CK2 for sampling. The latch circuit 124$_2$ latches a data signal supplied to the data input terminal DIN, responsive to the one-shot pulse CK2, to output the latched data signal to the data output terminal DOUT <01>. Then, the timing control circuit 123 supplies one-shot pulses CK3 and CK4 to the latch circuits 124$_3$ and 124$_4$, respectively, upon receipt of changes of (A1, A0) from (0, 1) to (1, 0) and from (1, 0) to (1, 1). The latch circuits 124$_3$ and 124$_4$ latch a data signal supplied to the data input terminal DIN, responsive to the one-shot pulses CK3 and CK4, to output the latched data signals to the data output terminals DOUT <10> and <11>, respectively. The latch circuits 124$_1$ to 124$_4$ may be configured from edge trigger type D registers, or the latch circuits which output and hold input data at data terminals D from output terminals Q without alteration, when clock terminals CK are at a high level and output the latched values irrespective of input values at the data terminals D when the clock terminal CK is at the low level.

Referring to FIG. 3, there may be provided a retiming circuit for adjusting timings of outputting data to the data output terminals DOUT <00> to <11> from the latch circuits 124$_1$ to 124$_4$ at a latch output timing of e.g. the latch circuit 124$_4$. Referring to FIG. 3, for 16-bit data, 16 latch circuits 124$_1$ are provided for the bus line 114$_1$ for <00>. Further, as a strobe signal for generating the clock CK1 associated with the leading address (A0, A1)=(0, 0) of a selected page, a detection signal from an address transition detecting circuit (ATD) not shown for detecting address transitions of the upper bits A17 to A2 of the address signal input to the address and data common terminals 107 may be employed, in place of the address valid signal/ADV.

Figure 4:
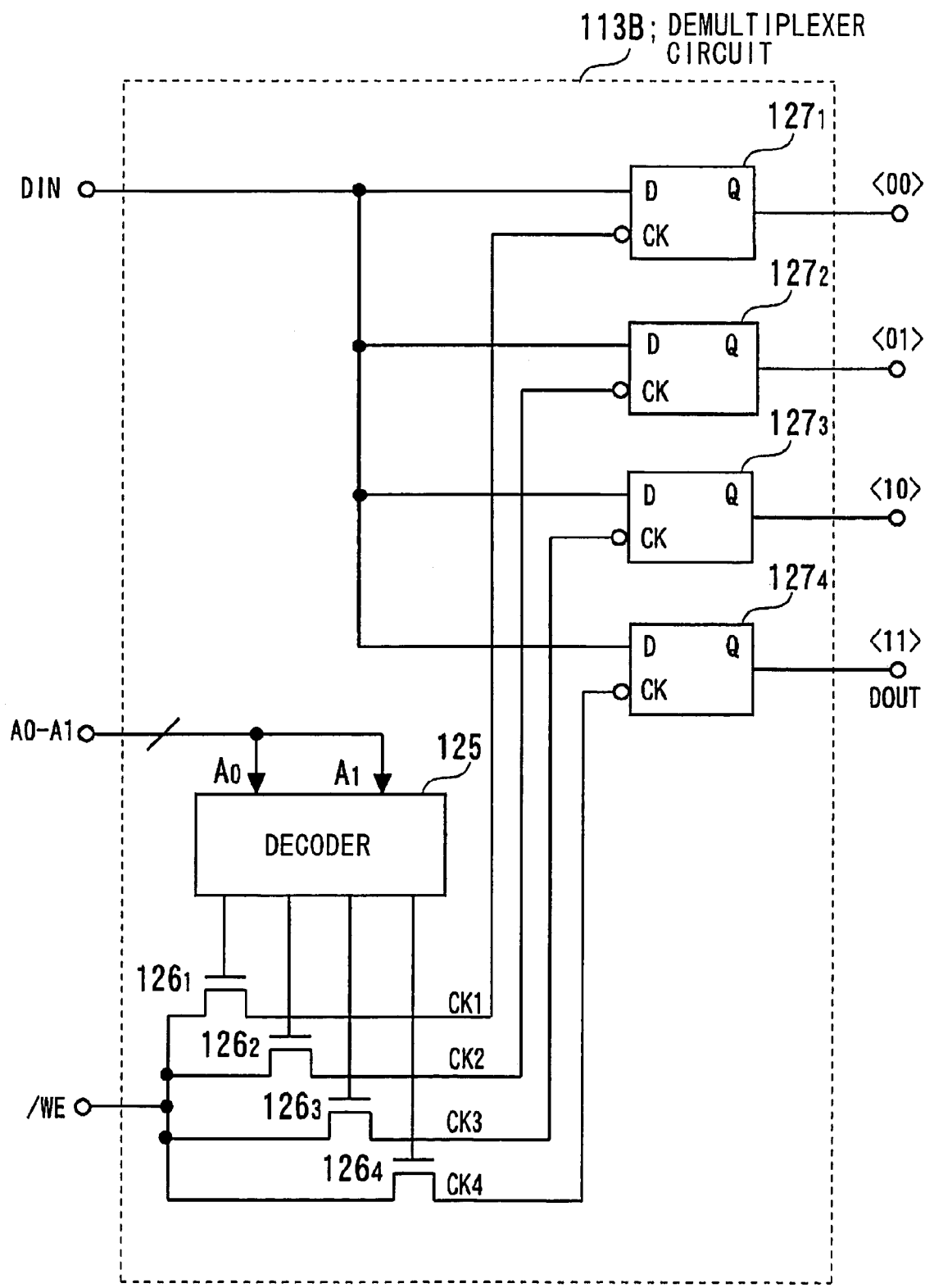
FIG. 4 is a diagram showing another configuration of the demultiplexer circuit in the embodiment of the present invention.

FIG. 4 is a diagram showing other configuration of the demultiplexer circuit 113B of the multiplexer/demultiplexer circuit 113. Referring to FIG. 4, in this demultiplexer circuit 113B, the timing control circuit 123 in FIG. 3 is constituted from a decoder circuit 125 and four switch devices 126$_1$ to 126$_4$. Latch circuits 127$_1$ to 127$_4$ for latching data signals are configured to sample signals at data input terminals D responsive to fall transition of the clock signals. One terminals of the switch devices 126$_1$ to 126$_4$ are connected in common to the terminal 110 for the write enable signal/WE, and other terminals are connected to clock terminals of the latch circuits 127$_1$ to 127$_4$, respectively. The data input terminal DIN of the demultiplexer circuit 113B is connected to the data line 117 in FIG. 1, and the data output terminals DOUT <00>, <01>, <10>, and <11> are connected to the write buses of the buses 114$_1$ to 114$_4$, respectively.

Decoded outputs of the decoder 125 that receives the lower two bits of the address signal A0 and A1 are connected to the control terminals of the switch devices 126$_1$ to 126$_4$, respectively. When (A1, A0) takes (0,0), (0,1), (1,0), and (1,1), the switch devices $126_1$, $126_2$, $126_3$, and $126_4$ are switched on, respectively, and supplies the write enable signal/WE to the corresponding latch circuits $127_1$ to $127_4$ as a sampling clock. In the example shown in FIG. 4, though each of the switch devices $124_1$ to $124_4$ is constituted from the n-channel pass transistor, the present invention is not limited to such a configuration. Referring to FIG. 4 as well, the retiming circuit for adjusting timings of outputting data to the bus lines $114_1$ to $114_4$ for <00> to <11> from the latch circuits $127_1$ to $127_4$ at a latch output timing of the latch circuit $127_4$, for example, may be provided, as in FIG. 3. Referring to FIG. 4, for 16-bit data, 16 latch circuits $127_1$ are provided for the bus line $114_1$ for <00>, for example. The latch circuits $127_1$ to $127_4$ may be configured from edge trigger type D registers, or the latch circuits which output and hold input data at data terminals D from output terminals Q without alteration, when clock terminals CK are at the low level and output held values therein irrespective of input values at the data terminals D when the respective terminals CK are at the high level. Further, the decoding logic circuits of the decoder 121 shown in FIG. 2 and the decoder 125 shown in FIG. 4 may be of course made common.

Figure 5:
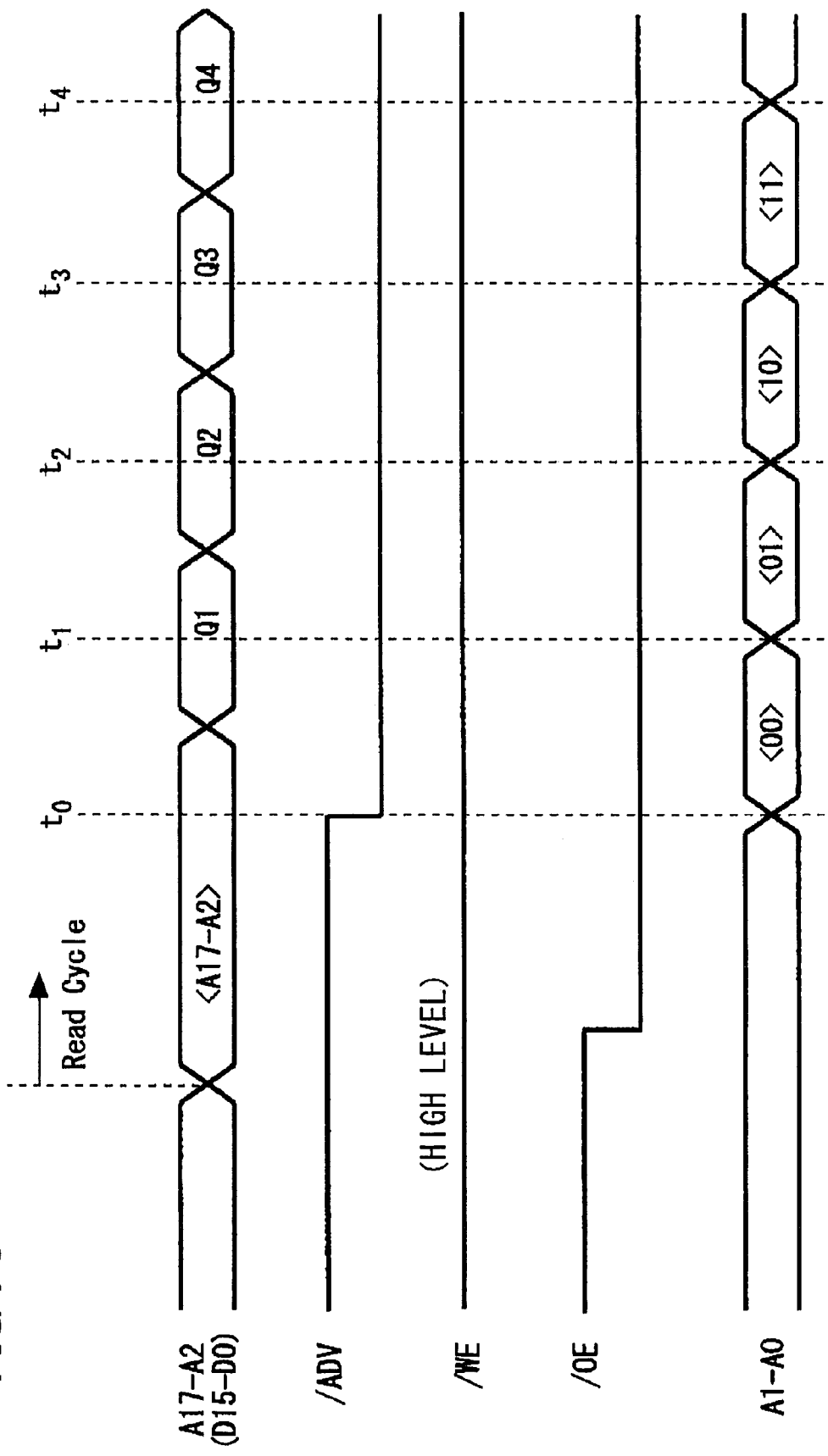
FIG. 5 is a timing diagram for explaining a read operation in the embodiment of the present invention.

FIG. 5 is a timing diagram showing an example of a read operation in the semiconductor memory device according to the present embodiment. Referring to FIGS. 1, 2, and 5, during a read cycle, after A17 to A2, upper 16 bits of the address signal have been fed to the address and data common terminals 107, the output enable signal/OE has been activated, and then the address valid signal/ADV has been activated, word data signals Q1 to Q4 are consecutively output from the address and data common terminals 107, corresponding to the values of (A1, A0), the lower two bits of the address signal input to the dedicated address terminals 108 which are (0, 0), (0, 1), (1, 0) and (1, 1).

Figure 6:
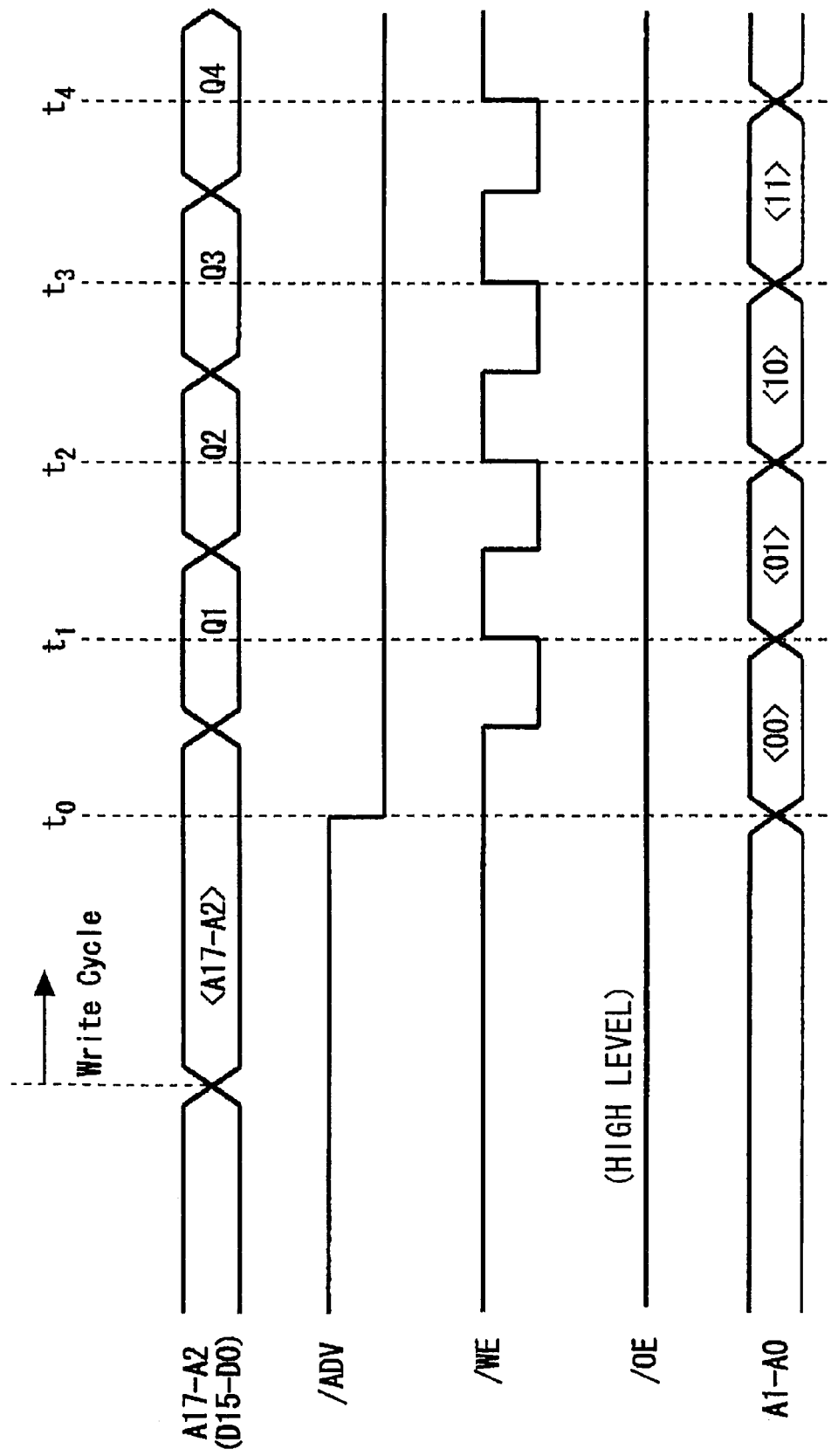
FIG. 6 is a timing diagram for explaining a write operation in the embodiment of the present invention.

FIG. 6 is a timing diagram showing an example of a write operation among the operations of the semiconductor device according to the present embodiment. In the example shown in FIG. 6, the circuit configuration shown in FIG. 4 is employed as the demultiplexer circuit of the multiplexer/demultiplexer circuit 113 in FIG. 1. Referring to FIGS. 1, 4, and 6, during a write cycle, after A17 to A2 of the address have been supplied to the address and data common terminals 107 and then the address valid signal /ADV has been activated, write word data signals Q1 to Q4 sequentially input to the address and data common terminals 107, corresponding to the values of (A1, A0), the lower two bits of the address signal input to the dedicated address terminal 108, which are (0, 0), (0, 1), (1, 0), and (1, 1), are consecutively sampled in synchronization with the falling edge of the write enable signal/WE and output onto the buses $114_1$ to $114_4$.

Figure 7:
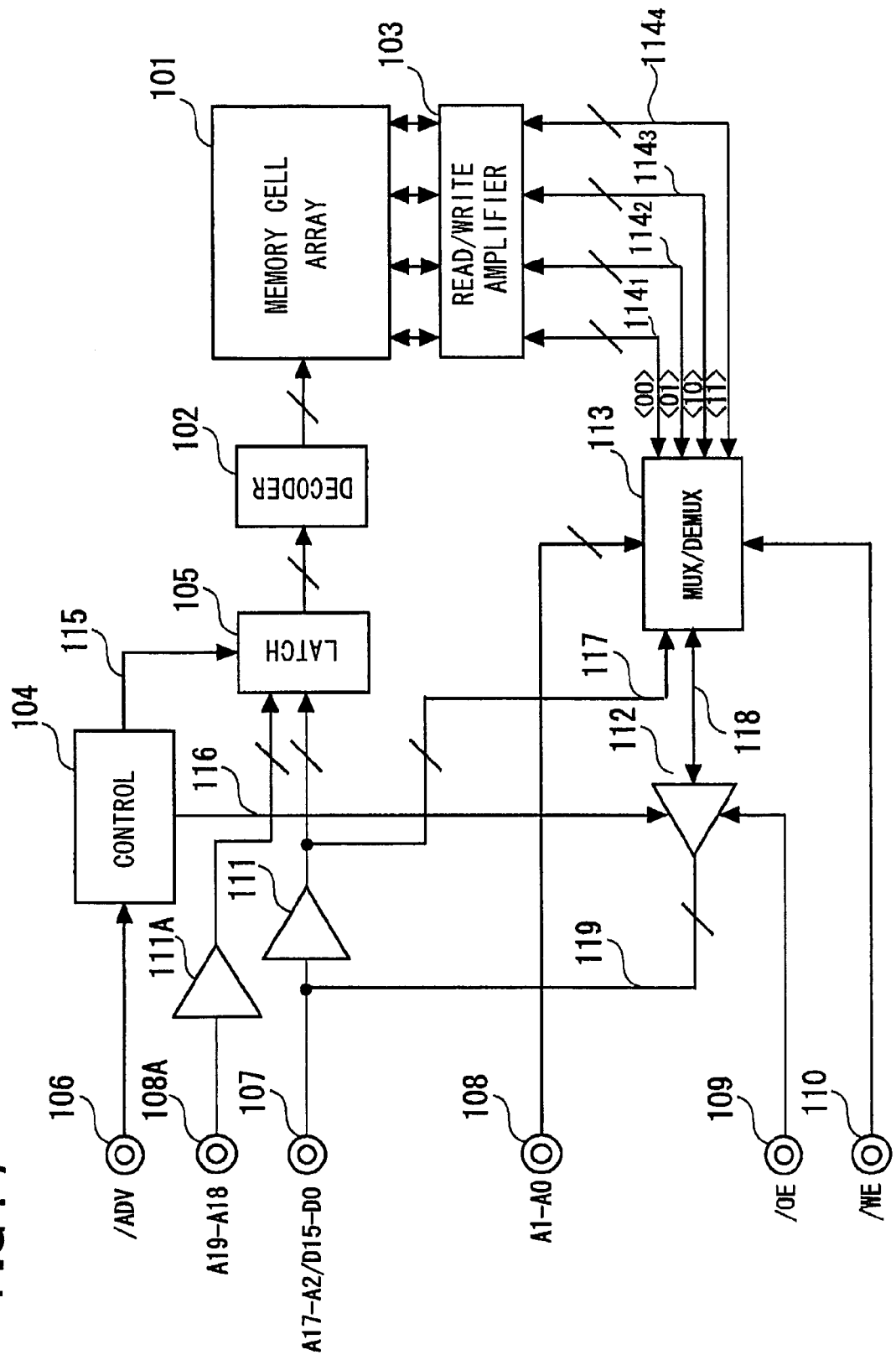
FIG. 7 is a diagram showing an example of a variation of the embodiment of the present invention.
Figure 8:
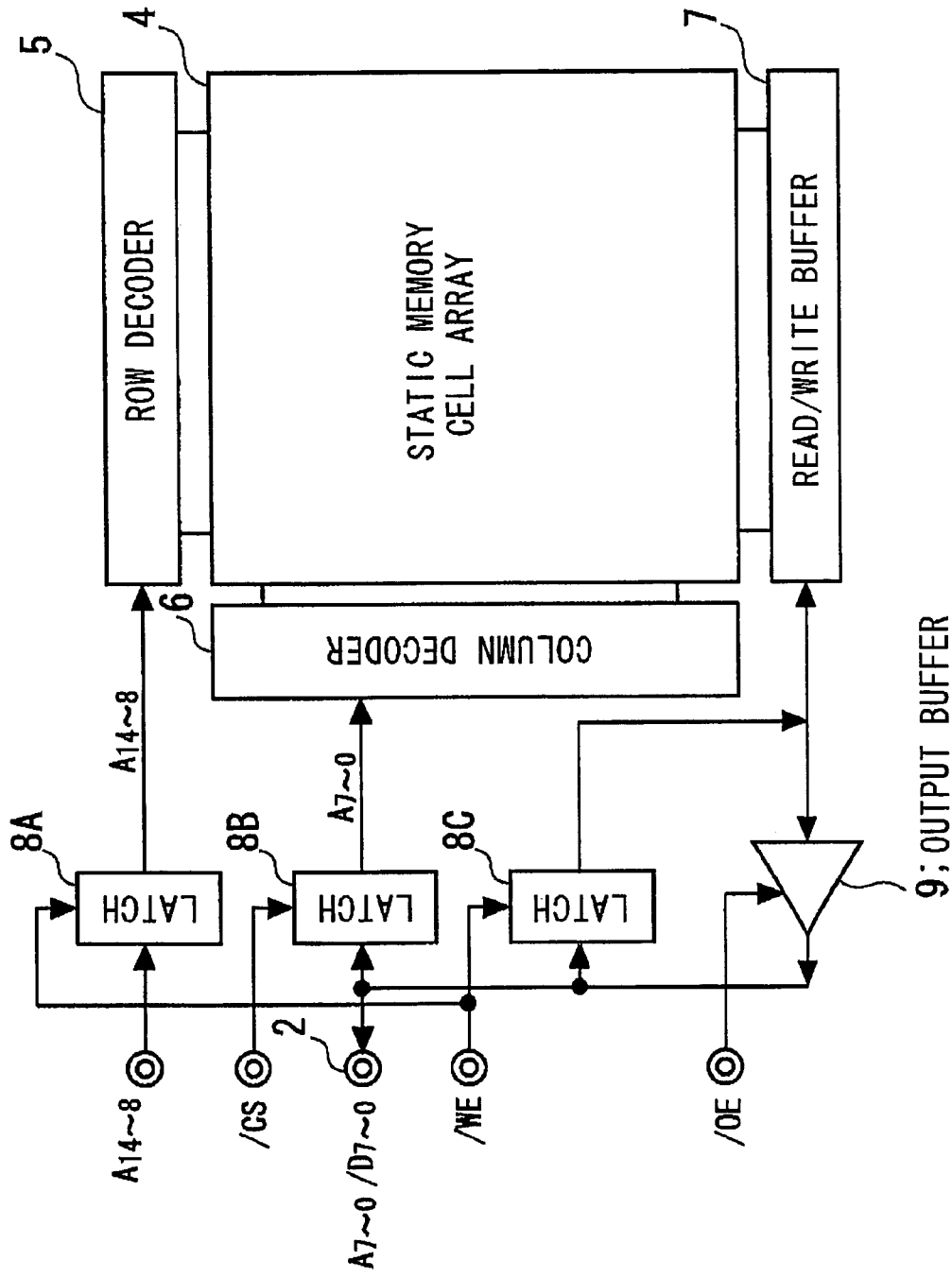
FIG. 8 is a diagram showing a configuration of a conventional address-and-data-multiplexing type semiconductor memory device.
Figure 9A:
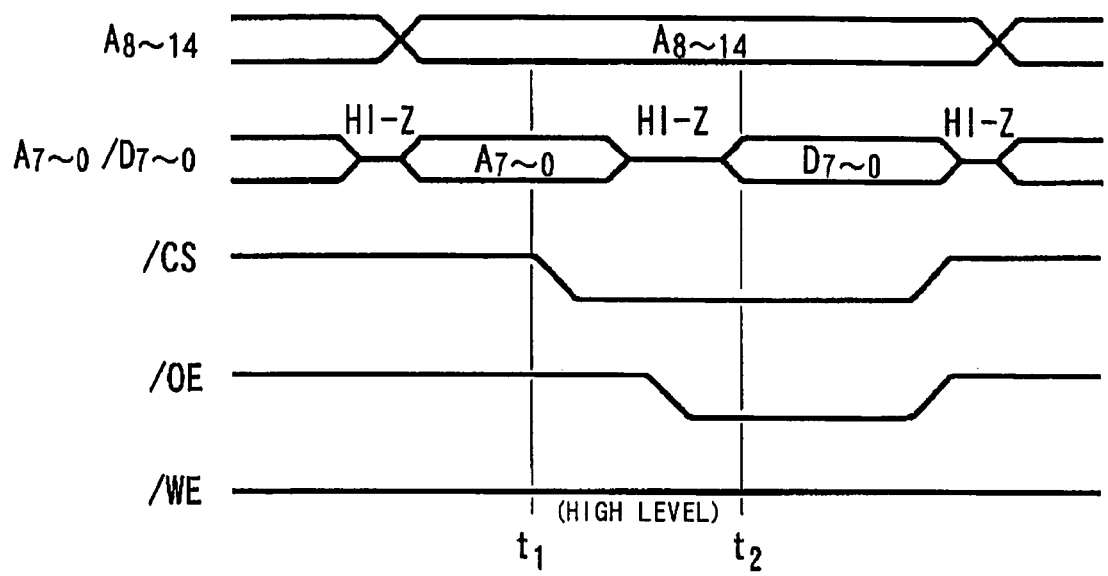
FIGS. 9A and 9B are timing diagrams for explaining read and write operations in FIG. 8.
Figure 9B:
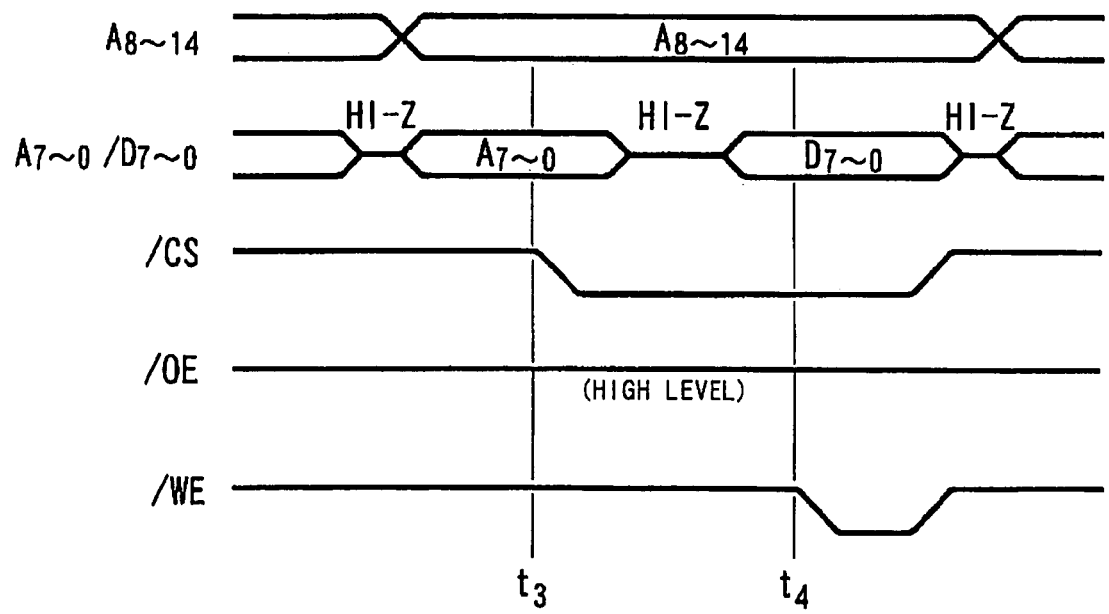

In the embodiment described before, shown in FIG. 1, the address terminals are constituted from the terminal for a page address of lower m bits (two bits) and the terminal shared with the data terminal for data representing upper n bits (16 bits), and the upper bit address signal and the data signal are constituted from the same number of bits (16 bits). The present invention is not limited to such a configuration. FIG. 7 is a diagram showing an example of a variation of the embodiment shown in FIG. 1.

Referring to FIG. 7, it may be configured that the address signal is constituted by 20 bits A19 to A0, and the data signal is 16 bit width. Then, it may be configured that the lower two bits of the address signal A1 and A0 are input from the dedicated address terminals 108 as the page address, input of the address signal A17 to A2 and input and output of data signals D15 to D0 are shared by the address and data terminals 107, and upper two bits of the address signal A19 to A18 are input from a dedicated address terminals 108A. That is, in this variation example, the address terminals are constituted from the terminal dedicated to page address terminals 108 for lower m bits (two bits), common terminals 107 shared with the terminal for data representing n bits (16 bits), and further the dedicated address terminals 108A for p bits (two bits).

The configuration shown in FIG. 7 performs the same operation as the embodiment described before except that the number of bits of the address signal in higher order than the address signal specifying the address in the page is greater than that in the embodiment in FIG. 1. More specifically, at the times of a read and a write, upper 18 bits of the address signal A19 to A2 input from the dedicated address terminals 108A and the address and data common terminals 107 are supplied to the input terminal of the latch circuit 105 for 18 bits. The latch circuit 105 then latches inputs according to the latch timing signal 115 from the control circuit 104 to supply the latched signals to the decoder 102. After the upper 18 bits of the address signal A19 to A2 have been latched, the address and data common terminals 107 are used as the data terminals, and using the lower two bits of the address signal A1 and A0, consecutive output or input of word data signals within a page is performed through the address and data common terminals 107.

The above description was given, using the semiconductor memory device compliant with an asynchronous type SRAM interface as an example of the present invention. The semiconductor memory device according to the present embodiment, compliant with the asynchronous type SRAM interface, described above is suitable for use in terminal devices such as cellular phones, PDAs (personal digital assistants), and the like for which increased capacity and high-speed operations are required. The present invention, however, is not of course limited to such applications.

In the above embodiment, an arbitrary signal (such as an address latch enable signal) indicating that the address signal is valid may be of course employed in place of the address valid signal.

In the embodiment described above, a description was given, on the assumption that the data terminal of the address and data common terminal 107 is an I/O terminal (an input/output terminal). The data terminal combined with the address terminal for sharing may be of course the data output terminal or the data input terminal, for example. In a semiconductor memory device having a configuration in which data input/output is separated between an input pin and an output pin, the address and data common terminal 107 may be employed as the data output terminal for outputting read data. In this case, referring to FIG. 1, the multiplexer/demultiplexer circuit 113 is constituted from the multiplexer circuit (such as 113A in FIG. 2) alone, and the data line 117 is deleted. At the time of reading data, the multiplexer circuit receives outputs from the read amplifiers (sense amplifiers) and performs control so that multiplexed data is output to the output buffer 112.

Likewise, the address and data common terminal 107 may be employed as the data input terminal for receiving write data. In this case, the multiplexer/demultiplexer circuit 113 in FIG. 1 is constituted from the demultiplexer circuit (113B in FIGS. 3 and 4) alone, and the circuits (output buffer 112, data line 118) in an output system connected to the address and data common terminal 107 are deleted. The demultiplexer circuit is configured to receive multiplexed data input from the address and data common terminal 107 through the data line 117, and separates the data into a plurality of data, for output to the corresponding write amplifiers.

In the embodiment described above, the configurations of the buses 114 and the read/write amplifier 103 from the multiplexer/demultiplexer circuit 113 onward may be of course the configurations of the circuits for other arbitrary read/write system, if a plurality of data is transferred in parallel. The read/write amplifier 103 may be a sense amplifier, for example. Further, the read bus and the write bus may be of course configured from a common bidirectional bus.

Incidentally, in the embodiment described above, the memory cell array 101 may be of course constituted, using a DRAM cell array as well as an SRAM cell array. Since a DRAM is constituted from one transistor per cell (two transistors per cell even in the case of a dual port), the DRAM excels an SRAM in terms of area, power consumption, and cost. Thus, the DRAM provides advantages of SRAM devices by making interface-compatible with SRAM in pin arrangement, timings, and functions, for example, and can effect improvements in device integration, power consumption, and cost, thereby being made suitable for applications to portable terminals and the like.

Figure 11:
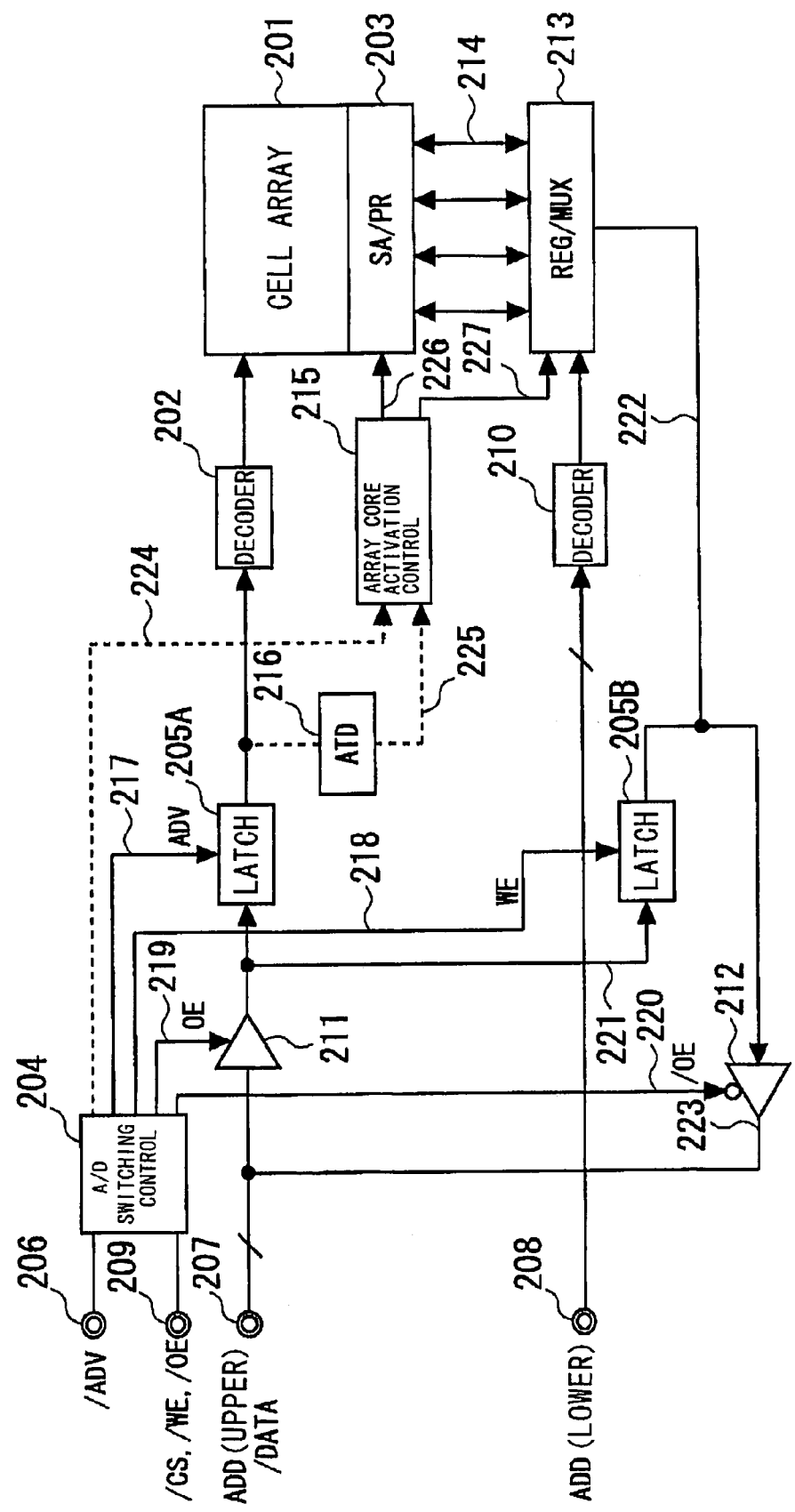
FIG. 11 is a diagram showing a configuration of another embodiment of the present invention.

FIG. 11 is a diagram showing a configuration of still another embodiment of the present invention. By applying the present invention to a semiconductor memory device (pseudo-SRAM) having a cell array 201 configured from memory cells (DRAM cells) that need refreshing for data retention, an automatic refresh function, and an interface corresponding to SRAM specifications, the number of pins is reduced. At the same time, access time reduction and improvement in data processing performance are achieved.

Referring to FIG. 11, the semiconductor memory device according to the present embodiment includes the cell array 201 having a plurality of bits lines (not shown), a plurality of word lines (not shown), and DRAM memory cells (not shown) at intersections between the bit lines and the word lines, a decoder 202 for receiving an address signal for decoding, activating a selected word line, and activating a selected column signal, and a sense amplifier/precharge (SA/PR) circuit 203 for precharging a bit line (not shown), reading of data output from a memory cell (not shown) to a bit line (not shown), writing of data to a memory cell, and performing a refreshing operation.

The semiconductor memory device according to the present embodiment includes as external terminals (pins), address and data common terminals 207 for receiving upper bits of an address signal supplied from the outside of the semiconductor memory device and inputting and outputting data signals, dedicated address terminals 208 for receiving lower bits of the address signal supplied from the outside of the semiconductor memory device, a terminal 206 for receiving the address valid signal /ADV supplied from the outside of the semiconductor memory device, and terminals 209 for respectively inputting a chip select signal /CS, the write enable signal /WE, and the output enable signal /OE supplied from the outside of the semiconductor memory device.

The semiconductor memory device according to the present embodiment further includes an address/data switching circuit 204, latches 205A and 205B, a decoder 210, an input buffer 211, an output buffer 212, a register/multiplexer circuit 213, and an array core activation control circuit 215.

The address/data switching control circuit 204 receives the address valid signal /ADV input from the terminal 206, the chip select signal /CS, write enable signal /WE, and output enable signal /OE input from the terminals 209, and generates a control signal (ADV) 217, a control signal (WE) 218, a control signal (OE) 219, and a control signal (/OE) 220 to be supplied to the circuits inside the semiconductor memory device, to output the generated signals to the corresponding circuits, in response to switching between an address and data at the address and data common terminals 207. In the example shown in FIG. 11, the chip select signal /CS, write enable signal /WE, and output enable signal /OE supplied from the outside of the semiconductor memory device are all set to be active at the low level. These signals may be of course the signals that are active at the high level.

The input buffer 211 inputs an input signal from the address and data common terminals 207. When the control signal (OE) 219 output from the address/data switching control circuit 204 is high (or when an output from the address and data common terminal 207 is disabled and in an input mode), the input buffer is made active and outputs the input signal input from the address and data common terminals 207, from its output terminal. When the control signal (OE) 219 is low, the input buffer 211 is made inactive (to be an off state) and its output is brought to a high impedance state. The output terminal of the input buffer 211 is connected in common to the input terminals of two latches 205A and 205B.

The latch 205A samples the address signal (upper address signal) from the input buffer 211 based on the control signal (ADV) 217 output from the address/data switching control circuit 204, and outputs the result of sampling to the decoder 202. After the latch 205A has sampled the upper address signal based on the control signal (ADV) 217, the address and data common terminals 207 are used as the data terminals.

The latch 205B samples the data signals 221 output from the input buffer 211 based on the control signal WE output from the address/data switching control circuit 204 and outputs the result of sampling to the register/multiplexer (REG/MUX) circuit 213 through a data line 222.

The input terminal of the output buffer 212 is connected to the data line 222, and its output terminal is connected to the address and data common terminal 207. The output buffer 212 samples a signal input to its input terminal based on the control signal (/OE) 220 output from the address/data switching control circuit 204, and outputs the result of sampling to the address and data common terminal 207. When the control signal (/OE) 220 is low (output enabled), the output buffer 212 is activated, receives a data signal on the data line 222, to output the data signal 223 to the address data common terminal 207. When the control signal (/OE) 220 is high, the output buffer 212 is deactivated (to be the off state), and its output is in the high impedance state.

The decoder 210 receives the lower bits of the address signal input from the dedicated address terminal 208, for decoding, and outputs the result of decoding to the register/multiplexer circuit 213. This decoder 210 corresponds to the decoder 121 and the like (refer to FIGS. 2 and 4) for decoding lower bits (A0, A1) in the embodiment described before.

The register/multiplexer circuit (REG/MUX) 213 in the present embodiment corresponds to the configuration in which the decoder 121 of the multiplexer/demultiplexer (MUX/DEMUX) 113 in FIG. 1 or the like is provided outside the circuit. That is, the decoder is not provided inside the register/multiplexer (REG/MUX) circuit 213. At the time of a write in the page mode, the register/multiplexer (REG/MUX) circuit 213 receives data signals input serially from the address and data common terminal 207 for storage of one page within the register therein, and then delivers the one page of data to the sense amplifier/precharge circuit 203 via the buses 214 in parallel. At the time of a read in the page mode, the register/multiplexer (REG/MUX) circuit 213 receives one page of data output from the sense amplifier/precharge circuit 203 in parallel, for output to the output buffer 212 serially.

More specifically, the register of the register/multiplexer (REG/MUX) circuit 213 fulfils a serial-to-parallel conversion function in which one page data represented by the data signals input serially from the address and data terminals 207 and transmitted onto the data line 222 is stored according to the result of decoding by the decoder 210 and the one page of the data is output to the sense amplifier/precharge circuit 203 through the buses 214. The multiplexer of the register/multiplexer (REG/MUX) circuit 213 fulfils a parallel-to-serial converting function in which one page of read-out data output from the cell array 201 through the sense amplifier/precharge circuit 203 is received and output serially one by one according to the result of decoding by the decoder 210.

In the present embodiment, based on a control signal 227 supplied from the array core activation control circuit 215 to the register of the register/multiplexer (REG/MUX) circuit 213, writing of data corresponding to the leading address within the page is performed. Then, control over writing of remainder of data within the page into the register may be performed, based on the result of decoding by the decoder 210 that decodes the address within the page.

Figure 12:
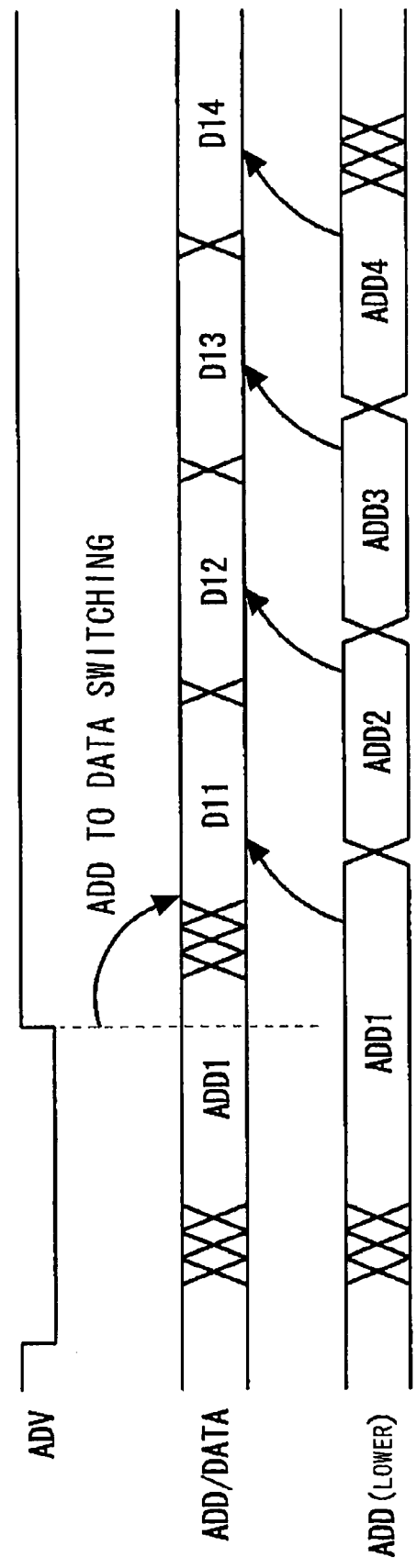
FIG. 12 is a timing diagram for explaining an operation of the another embodiment of the present invention in FIG. 11.

FIG. 12 is a timing diagram showing an example of an operation of the semiconductor memory device shown in FIG. 11. In this example, one page is constituted from four words. The lower address terminals 208 in FIG. 11 is set to be for two bits. Based on the transition of the address valid signal /ADV input to the terminal 206 from the high level to the low level, the address/data switching control circuit 204 makes the control signal (ADV) 217 from low to high. The latch circuit 205A samples an upper address output from the input buffer 211 at the rising transition of the control signal (ADV) 217, to supply the latched upper address to the decoder 202. After the latch circuit 205A has latched the upper address signal (after the rising transition of the control signal (ADV) 217), the address and data common terminals 207 are changed over from the address input terminals to the data input and output terminals.

On the other hand, the dedicated address terminals 208 constantly receive lower bits of the address signal. After the latch circuit 205A has latched the upper bit of the address signal, a page operation is performed based on the lower bit of the address signal. More specifically, based on the lower 4-bits of the address signal (ADD1, ADD2, ADD3, and ADD4) supplied to the dedicated address terminals 208, data signals (D11, D12, D13, and D14) indicating data within the page are serially output to the address and data common terminals 207. In the case of a write as well, after the upper bit of the address signal supplied to the address and data common terminals 207 have been latched by the latch circuit 205A, the write data signals (D11, D12, D13, and D14) input serially from the address and data common terminals 207 are sequentially supplied to the register/multiplexer circuit 213, based on the lower 4-bits of the address signal (ADD1, ADD2, ADD3, and ADD4) supplied to the terminals 208, in the same manner.

Referring to FIG. 11, in the present embodiment, the array core activation control circuit 215 is triggered by a control signal (ADV) 224 (that is activated in synchronization with a rise of the input address valid signal ADV like the signal 217) output from the address/data switching control circuit 204 used as a trigger signal for selecting the leading address (upper and lower addresses ADD1 in FIG. 12) in a page in the cell array 201. The array core activation control circuit 215, on receipt of the control signal 224 as a trigger signal, supplies a control signal 226 to the cell array 201 (constituted from a strobe signal for selecting a word line and a control signal for activating the sense amplifier/precharge circuit 203), and controls activation of the selected word line corresponding to the leading address (also referred to as a "base address") of the page. At the same time, the array core activation control circuit 215 supplies to the register/multiplexer circuit 213 the control signal 227 for capturing data at the leading address in the page in the register.

Alternatively, referring to FIG. 11, in the present embodiment, as another configuration for selecting the leading address in the page by the cell array 210, an address transition detecting circuit (ATD) 216 for receiving the upper address signal output from the latch circuit 205A and detecting the transition of the address signal may be provided, and the address transition detecting circuit (ATD) 216 may be configured to supply a trigger signal (ATD) 225 to the array core activation control circuit 215 when detecting the transition of the upper address. The array core activation control circuit 215, on receipt of the trigger signal 225, supplies the control signal 226 to the cell array 201, controls activation of a selected word line corresponding to the leading address (also referred to as the "base address") in the page, and supplies to the register/multiplexer circuit 213 the control signal 227 for capturing data at the leading address in the page in the register.

Figure 13:
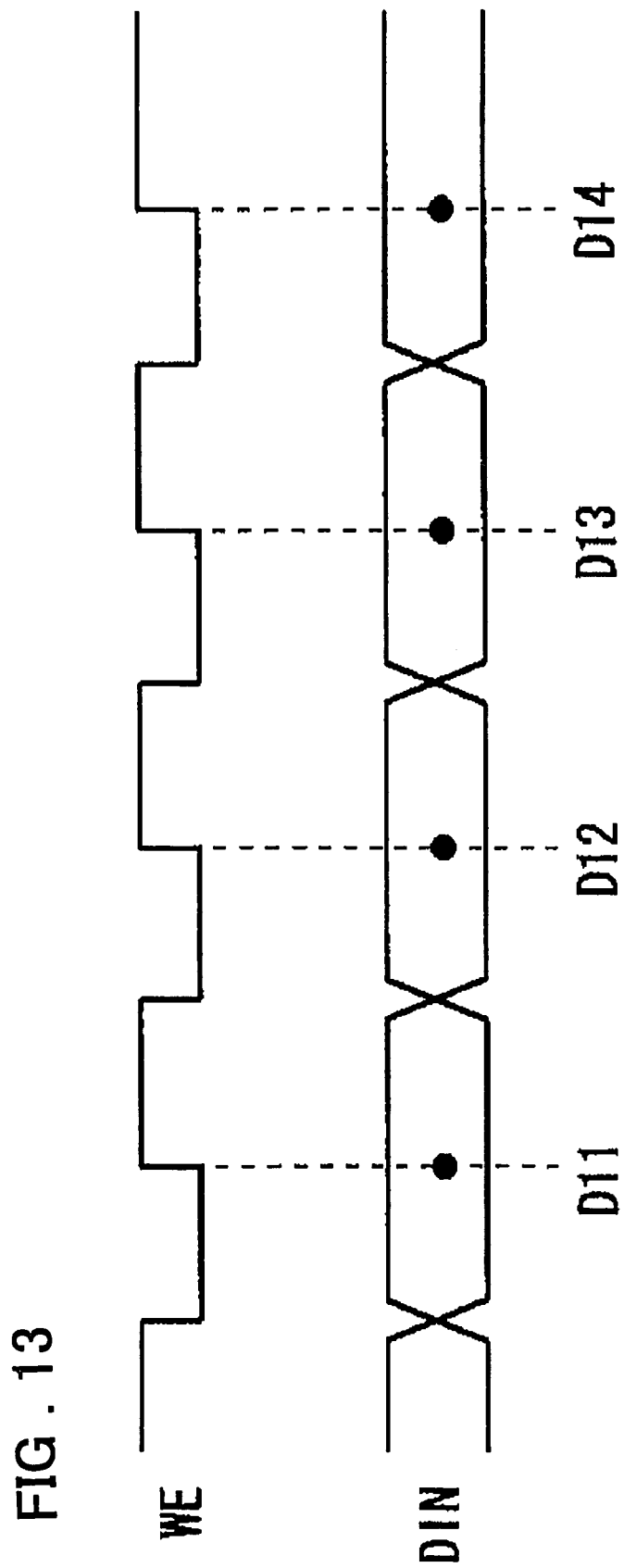
FIG. 13 is a timing diagram for explaining an operation of the another embodiment of the present invention in FIG. 11.

In the embodiment described above, shown in FIG. 11, for data writing in the page mode the control signal (WE) 218 output from the address/data switching control circuit 204 is employed, as shown in FIG. 11, as the sampling clock of the latch circuit 205B for serially capturing data from the address and data common terminal 207. As shown in FIG. 13, the address/data switching control circuit 204 generates four consecutive pulses that perform toggle inversion as the control signal (WE) 218, and the latch circuit 205B samples the four words of data D11, D12, D13, and D14 for one page, at the respective rising edges of the control signal (WE) 218, respectively.

In the embodiment described above, shown in FIG. 11, the cell array 201 is constituted from the pseudo-SRAM constituted from DRAM cells, and effects improvements in device integration, power consumption, and cost. At the same time, the embodiment implements high-speed processing while reducing the number of pins, thereby being made suitable for being applied to the memories for portable terminals having the asynchronous type SRAM interface.

Each of the embodiments described above can be of course applied to a read-only memory such as an EEPROM (Electrically Erasable and Programmable Read-Only Memory) as well.

The foregoing description was given in connection with the embodiments described above. The present invention, however, is not limited to the configurations of the embodiments described above, and naturally includes various variations and modifications that could be carried out by those skilled in the art within the principle of the present invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor memory device for receiving an address signal of (n+m) bits and making access to a memory cell array, n and m being predetermined positive integers, wherein said semiconductor memory device comprises:
   n common terminals shared between a part or all of address terminals for receiving the n bits of the address signal and data terminals for outputting a data signal with a bit width thereof being n bits or less;
   m dedicated address terminals for receiving the m bits of the address signal,
   wherein at a time of a read, after the n bits of the address signal have been input from said common terminals, a plurality of data signals within a page are consecutively read out through said common terminals, based on the m bits of the address signal input from said dedicated address terminals;
   a control circuit for receiving a control signal indicating that the address signal supplied to said semiconductor memory device from an outside of said semiconductor memory device is valid and generating a latch timing signal responsive to the control signal;
   a latch circuit for sampling the address signal input from said common terminals based on the latch timing signal and supplying the sampled address signal to a decoder for decoding the address signal; and
   a multiplexer circuit for receiving the plurality of data signals within the page read out from said memory cell array in parallel and performing control so that the plurality of data signals are multiplexed into a stream of data signals and sequentially output from said common terminals based on the m bits of the address signal input from said dedicated address terminal, at the time of the read.

2. The semiconductor memory device according to claim 1, wherein at a time of a write, after the n bits of the address signal have been input, a plurality of data signals consecutively input from said common terminal are written into a selected page, based on the address signal input from said dedicated address terminals.

3. The semiconductor memory device according to claim 1, further comprising an output buffer having an output terminal thereof connected to said common terminal; wherein
   said multiplexer circuit comprises:
   a plurality of switches having first terminals thereof connected in common to an input terminal of said output buffer and respective other terminals thereof connected to output terminals of corresponding read amplifiers; and
   a control circuit for controlling on and off of said plurality of switches based on the m bits of the address signal;
   said multiplexer circuit sequentially outputting the plurality of data signals output in parallel from said read amplifiers to an input terminal of said output buffer through said plurality of switches.

4. The semiconductor memory device according to claim 1, wherein a page comprises $2^m$ words, and consecutive accesses to $2^m$ word data within the page are made.

5. A semiconductor memory device for receiving an address signal of (n+m)bits and making access to a memory cell array, n and m being predetermined positive integers, wherein said semiconductor memory device comprises:
   n common terminals shared between a part or all of address terminals for receiving the n bits of the address signal and data terminals for receiving and outputting a data signal with a bit width thereof being n bits or less;
   m dedicated address terminals for receiving the m bits of the address signal,
   wherein at a time of a write, after the n bits of the address signal have been input from said common terminals, a plurality of data signals consecutively input from said common terminals are written into a selected page, based on the address signal input from said dedicated address terminals;
   a control circuit for receiving a control signal indicating that the address signal supplied to said semiconductor memory device from an outside of said semiconductor memory device is valid and generating a latch timing signal responsive to the control signal;
   a latch circuit for sampling the address signal input from said common terminals based on the latch timing signal and supplying the sampled address signal to a decoder for decoding the address signal; and
   a demultiplexer circuit for separating the plural data signals each sequentially input to said common terminals into a plurality of parallel data signals using the m bits of the address signal input from said dedicated address terminals and supplying the separated parallel data signals to said cell array, at the time of the write.

6. The semiconductor memory device according to claim 5, wherein said common terminals constitute input terminals for the n bits of the address signal and are also input and output terminals for performing data signal input and output in common.

7. The semiconductor memory device according to claim 5, wherein said demultiplexer circuit comprises:
   a plurality of latch circuits for receiving the data signal supplied to said common terminals from input terminals thereof in common and having respective output terminals thereof connected to input terminals of corresponding write amplifiers; and
   a timing control circuit for supplying respective sampling clock signals to said plurality of latch circuits according to the m bits of the address signal.

8. The semiconductor memory device according to claim 7, wherein said timing control circuit receives a control signal for controlling data writing and supplies the sampling clock signals generated based on the control signal to corresponding ones of said plurality of latch circuits.

9. The semiconductor memory device according to claim 5, wherein said demultiplexer circuit comprises a storage unit for storing one page of the data sequentially supplied to said common terminal, for output in parallel.

10. The semiconductor memory device according to claim 9, further comprising:
    a decoder for receiving the address signal input from said dedicated address terminals, for decoding, and outputting a signal for controlling data writing to said storage unit based on a result of the decoding.

11. A semiconductor memory device comprising:
    a plurality of address terminals for receiving an address signal of plural bits, a part of said address terminals constituting a common terminal shared with a data terminal for output and/or input,
    a part or all of a remainder of said address terminals each being used as a dedicated address terminal for making access within a page,
    wherein at least one of consecutive output and input of a plurality of data signals within a page selected by an address signal input from said common terminal is performed through said common terminal, based on the address signal input from said dedicated address terminal;

an address/data switching control circuit for receiving from an outside of said semiconductor memory device at least a first control signal indicating that an address signal supplied to said semiconductor memory device is valid, a second control signal for controlling data writing, and a third control signal for controlling output of read data and supplying a plurality of control signals required for circuits within said semiconductor memory device based on the input first through third control signals;

an input buffer having an input terminal thereof connected to said common terminal, for receiving a fourth control signal output from said address/data switching control circuit that is active, as an input control signal, when the third control signal for controlling the output of the read data is inactive, activation and deactivation of said input buffer being controlled by the input control signal, said input buffer outputting signals from said input terminal thereof when the activation is performed;

a first latch circuit for receiving, as a sampling clock signal, a fifth control signal output from said address/data switching control circuit that is active upon receipt of activation of the first control signal indicating that the address signal is valid, sampling the address signal output from said input buffer in response to the input sampling clock signal, and outputting the sampled address signal to a decoder for decoding the address signal;

a second latch circuit for receiving a sixth control signal output from said address/data switching control circuit as a sampling clock signal upon receipt of activation of the second control signal for controlling the writing and sampling the data signal output from said input buffer in response to the input sampling clock signal, to output the sampled data signal;

an output buffer for receiving a seventh control signal output from said address/data switching control circuit that is active, as an output control signal, when the third control signal for controlling the output of the read data is active, activation and deactivation of said output buffer being controlled by the output control signal, said output buffer outputting the read data to said common terminal when the activation is performed;

an in-page address decoder for receiving the address signal input from said dedicated address terminals and decoding an in-page address; and a register/multiplexer circuit including a multiplexer circuit having a storage unit for receiving a predetermined number of data for storage and retention, said register/multiplexer circuit storing a plurality of data signals output from said second latch circuit based on a result of the decoding by said in-page address decoder and outputting the plurality of data signals to said cell array in parallel at a time of a write in a page mode, and receiving the read data signals from said cell array in parallel and sequentially outputting the read data signals to said output buffer based on a result of the decoding by said in-page address decoder.

12. The semiconductor memory device according to claim 11, wherein said storage unit includes a register for storing one page of data.

13. The semiconductor memory device according to claim 11, further comprising:

a control circuit for receiving a trigger signal output from said address/data switching control circuit upon receipt of the activation of the first control signal indicating that the address signal is valid and outputting control signals for selecting a leading address in a page in said memory cell array.

14. The semiconductor memory device according to claim 11, further comprising:

an address transition detecting circuit for outputting a trigger signal when a transition of each of the address signal input from said common terminals is detected; and a control circuit for outputting a control signal for selecting a leading address in a page in said memory cell array upon receipt of the trigger signal output from said address transition detecting circuit.

15. A semiconductor memory device according to claim 13, wherein said control circuit outputs a control signal for selecting a leading address in a page in said memory cell array to said memory cell array and said register/multiplexer circuit upon receipt of the trigger signal.

16. The semiconductor memory device according to claim 11, wherein said cell array comprises dynamic memory cells requiring refreshing for data retention; and wherein said semiconductor memory device has an interface corresponding to that of a static random access memory.

17. An electronic device comprising said semiconductor memory device according to claim 11.

* * * * *